United States Patent [19]

Slatter

[11] 4,309,714
[45] Jan. 5, 1982

[54] GATE TURN-OFF DIODES AND ARRANGEMENTS INCLUDING SUCH DIODES

[75] Inventor: John A. G. Slatter, Crawley, England

[73] Assignee: U.S. Philips Corporation, New York, N.Y.

[21] Appl. No.: 969,029

[22] Filed: Dec. 13, 1978

[30] Foreign Application Priority Data

Dec. 20, 1977 [GB] United Kingdom ............... 52935/77

[51] Int. Cl.[3] ............................................ H01L 29/80
[52] U.S. Cl. ........................................ 357/22; 357/23; 357/55; 357/58; 357/88
[58] Field of Search ...................... 357/55, 58, 23, 22, 357/88

[56] References Cited

U.S. PATENT DOCUMENTS 4,092,660  5/1978  Blocker ............................... 357/55

Primary Examiner—Edward J. Wojciechowicz
Attorney, Agent, or Firm—Thomas A. Briody; Robert T. Mayer; Steven R. Biren

[57] ABSTRACT

A gate turn-off PIN diode has its anode and cathode adjacent to the same major surface of the device body. The anode and cathode regions are separated by a recess which extends into the body towards the gate region. Turn-off is effected by the spread of a depletion layer from the reverse-biased gate junction to the recess.

9 Claims, 8 Drawing Figures

GATE TURN-OFF DIODES AND ARRANGEMENTS INCLUDING SUCH DIODES

BACKGROUND OF THE INVENTION

This invention relates to gate turn-off diodes for power switching applications, particularly but not exclusively at high-frequency, and further relates to arrangements including such diodes.

Gate turn-off diodes and their advantages are described in the article entitled "A Field Terminated Diode" by D. E. Houston et al. In I.E.E.E. Transactions on Electron Devices, Vol ED-23, No. 8, August 1976, pages 905 to 911. These diodes, which are for power switching applications, comprise a gate turn-off diode for power switching applications comprising a semiconductor body having opposite first and second major surfaces, and comprising an n-type cathode region, a p-type anode region, a higher resistivity base region of one conductivity type through which a main current path extends between the cathode and anode regions, the base region having a conductivity type determining dopant concentration of at most $5 \times 10^{14}$ atoms per c.c. and forming a first p-n junction with one of the cathode and anode regions, a gate region which is of opposite conductivity type to the base region and forms with the base region a second p-n junction adjacent the main current path, and a gate electrode connected to the gate region for permitting this second p-n junction to be biased so as to permit interruption of said current path by a depletion layer extending from the biased second p-n junction. As described in said publication, the cathode region of these known devices adjoins one major surface of the body and is separated by the base region from the anode region which adjoins the opposite major surface; the gate region is in the form of a grid of stripes buried in the base region and extending parallel to the major surfaces.

Such known gate turn-off diodes are not easy to manufacture, particularly as regards the buried grid. It is not easy to obtain a low series resistance along the length of the grid stripes between the gate electrode and the active area of the device; too high a value for this resistance reduces the biasing of the second p-n junction along the length of the stripes and reduces the amount of current which can be carried by the grid. Furthermore, when the diode has been turned off by a sufficiently large gate voltage, this grid resistance can result in the device being turned on again by increasing the anode voltage; this can result in the diode being quite easily turned on again by a surge in the anode voltage.

SUMMARY OF THE INVENTION

According to a first aspect of the present invention, there is provided a gate turn-off diode for power switching applications in which the cathode and anode regions adjoin said first major surface and the gate region is on the side of the base region remote from said first major surface, the thickness of the base region between the first and second p-n junctions is more than 25 microns, and a recess present in said first major surface laterally separates the anode and cathode regions and extends through the base region towards the second p-n junction so that the depletion layer from the biased second p-n junction can extend to the recess to interrupt the current path.

By using a diode structure in accordance with the invention the need to provide a buried grid is avoided, thus simplifying the manufacture of the device. The gate region is in the form of an entire region of opposite conductivity type on one side of the base region and can have a high conductivity; thus the gate connection through this region from the active area of the device to the gate electrode can be made with an extremely low series resistance.

Diode structures in accordance with the invention are less sensitive to turn-on by an increase in anode voltage (for example by a factor of 10 as compared with gate grid diodes) so that a higher increase in the anode voltage is needed to re-establish conduction; thus the OFF-state of such a device in accordance with the invention is more likely to be maintained during anode voltage surges.

Preferably the cathode or anode region which is of the same conductivity type as the base region extends deeper in the body towards the gate region than does the anode or cathode region of opposite conductivity type, thereby reducing the voltage drop across the diode in the ON-state. Thus, the distance between the gate region and the anode or cathode region of the said opposite conductivity type cannot be reduced below a value determined by the breakdown voltage of the diode, whereas the distance between the gate region and the other (cathode or anode) region can be smaller so that this other region can extend deeper in the body. Because of this smaller distance, part of the current path which would have been in a part of the higher resistivity base region is now in the lower resistivity cathode or anode region, thus reducing the resistance along the current path. It has been found that by providing this deeper cathode or anode region, a minimum which occurs in the charge carrier concentration along this current path in the ON-state can be shifted along the path and away from the location where the cross-sectional area of the current path is restricted to a small value between the recess and the gate region. This shift of the carrier concentration minimum to a wider area of the current path appears to be a further mechanism which significantly reduces the resistance through the diode in the ON-state.

As described in detail hereinafter, the said recess is preferably a groove having a V-shaped cross-section.

According to a second aspect of the invention there is provided a control arrangement for controlling the transmission of current along a current path which includes a gate turn-off diode in accordance with the first aspect of the invention, in which the current path is connected between the anode and cathode regions of the diode, and means for applying a control signal to the diode are connected to the gate electrode to permit interruption of the current path between the anode and cathode regions by a depletion layer extending to the said recess from the biased second p-n junction.

According to a third aspect of the invention there is provided an arrangement comprising a load and a current path connected between a supply terminal and one side of the load, said current path comprising a gate turn-off diode in accordance with the first aspect of the invention having one of its anode or cathode connected to the load and the other of its anode or cathode connected to the supply terminal, and means connected to the gate electrode for applying a control signal to permit interruption of the current path between the anode and cathode by a depletion layer extending to the recess from the biased second p-n junction.

In order to illustrate the these and other features in accordance with the invention and their advantages, embodiments of the invention will now be described, by way of example, with reference to the accompanying diagrammatic drawings, in which:

DETAILED DESCRIPTION

Figure 1:
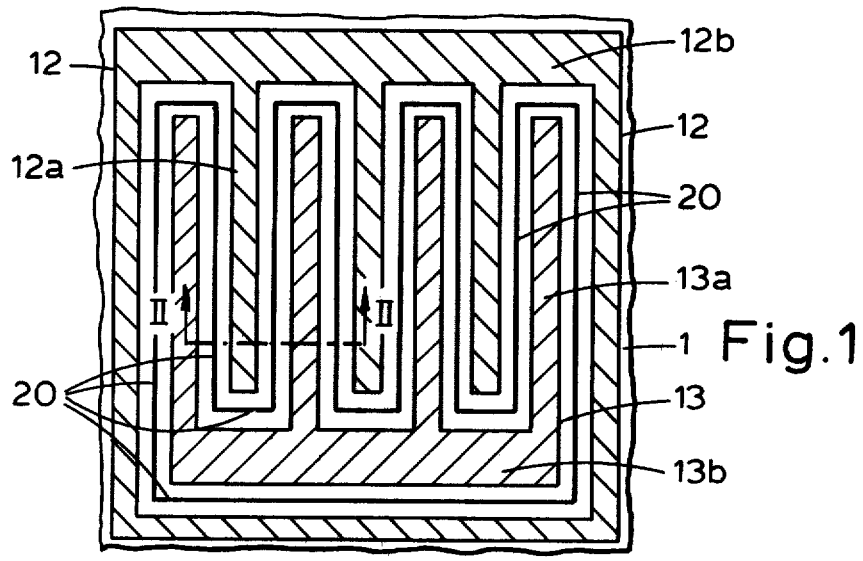
FIG. 1 is a plan view of the active portion of the semiconductor body of a gate turn-off diode in accordance with the first aspect of the invention.

It should be noted that the drawings are diagrammatic and not drawn to scale; the relative dimensions and proportions of some parts of the Figures have been shown exaggerated or reduced for the sake of clarity. The same reference numerals as used in one Figure are generally used to refer to the same or similar parts in the other Figures.

Figure 2:
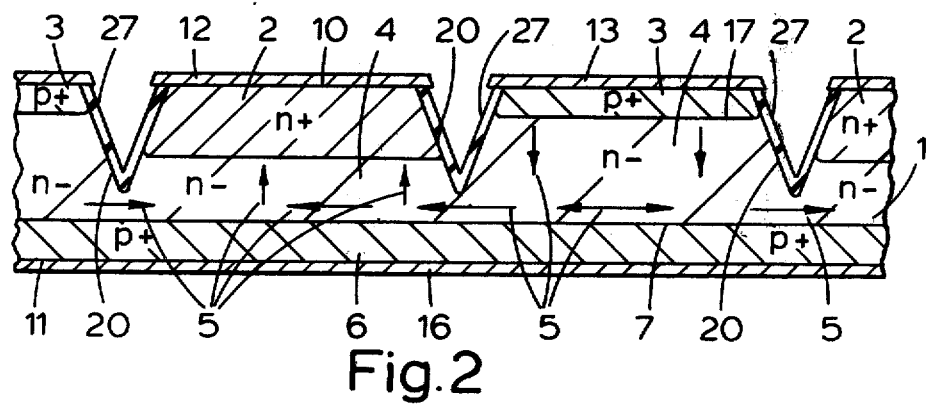
FIG. 2 is a cross-section of part of the diode body portion of FIG. 1 taken on the line II—II of FIG. 1.
Figure 3:
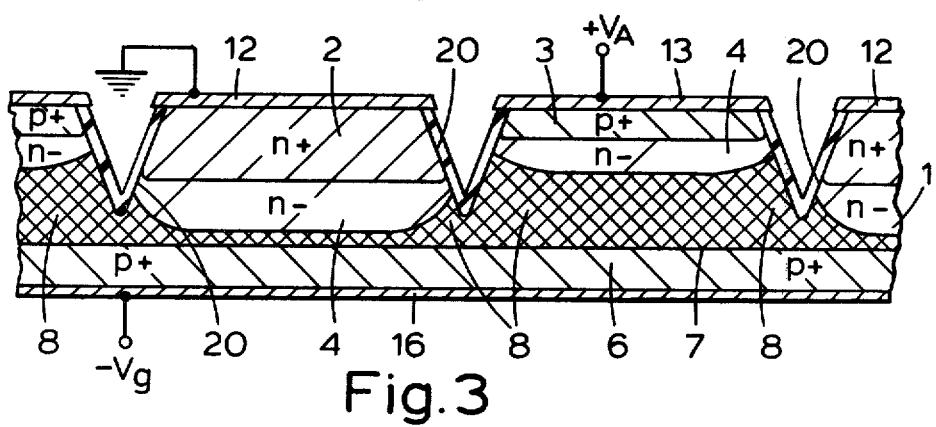
FIG. 3 is a cross-sectional view corresponding to that shown in FIG. 2 and illustrating the OFF-state of the diode.

The gate turn-off diode illustrated in FIGS. 1 to 3 comprises a semiconductor body 1 of monocrystalline silicone having an n-type cathode region 2, a p-type anode region 3, and a higher resistivity base region 4 of one conductivity type, see FIG. 2; the base region 4 forms a first p-n junction 17 with one of the regions 2 and 3; through the base region 4 a main current path 5 extends between the cathode and anode regions 2 and 3, as shown in FIG. 2; a gate region 6 of opposite conductivity type to the base region 4 forms with the region 4 a second p-n junction 7 adjacent the main current path 5; a gate electrode 16 is connected to the gate region 6 for permitting the p-n junction 7 to be biased (as shown in FIG. 3) so as to permit interruption of the current path 5 by a depletion layer 8 extending from the baised p-n junction 7. As shown in FIGS. 2 and 3, the gate region 6 is on one side of the base region 4 and the cathode and anode regions 2 and 3 are on the other side. The cathode and anode regions 2 and 3 adjoin a common major surface 10 of the body. A recess 20 in the form of a groove is present in this surface 10 and laterally separates the cathode and anode regions 2 and 3; the groove 20 extends through the base region 4 towards the p-n junction 7 so that the depletion layer 8 from the biased junction 7 can extend to the groove 20 to interrupt the current path 5.

The diode is suitable for power switching applications and so has a thick high resistivity base region 4. In order to obtain such a high resistivity the conductivity-type determining dopant concentration of the region 4 should be at most $5 \times 10^{14}$ atoms per c.c.

In the particular form shown in FIGS. 1 to 3, the base region 4 is n-type and has a resistivity of, for example, 50 ohm-cm (which corresponds to a donor concentration of $10^{14}$ dopant atoms/c.c.) The p-type anode region 3 therefore forms a p-n junction 17 with this n-type base region 4. The thickness of the base region 4 as measured between the opposed p-n junctions 7 and 17 should be more than 25 microns for power operations, and may be for example 70 microns.

The gate region 6 is p-type and is highly doped with acceptors so as to have a very low resistivity; the region 6 may have an acceptor surface concentration of, for example, $10^{20}$ atoms/c.c. The cathode and anode regions 2 and 3 are also highly doped (for example $10^{20}$ dopant atoms/c.c.) and are contacted at the surface 10 by electrodes 12 and 13 respectively. The gate region 6 adjoins the opposite major surface 11 of the body 1, and in this embodiment the region 6 is contacted at this surface 11 by the electrode 16.

In the plan view of FIG. 1, the meandering line having the reference numeral 20 represents the apex of the groove 20 shown in FIG. 2, and the cathode and anode electrodes 12 and 13 are shaded in opposite directions for the sake of clarity. As shown in FIG. 1, the electrodes 12 and 13 include interdigitated finger portions 12a and 13a respectively, with the groove 20 meandering between them. The width of each finger portion 12a and 13a may be, for example, 90 microns. The electrodes 12 and 13 also have wider contact areas 12b and 13b, respectively, to which wires or other connections may be bonded to connect the electrodes 12 and 13 to cathode and anode terminals respectively of the diode envelope. Although the outlines of the cathode and anode regions have not been indicated in FIG. 1 for the sake of clarity, it should be understood that these regions 2 and 3 have a corresponding pattern to that of the electrodes 12 and 13. The total active device area shown in FIG. 1 may be, for example, 2 m.m. by 2 m.m.

When operated with no gate bias, the device behaves like a lateral P-I-N diode of which the symbol "I" represents an intrinsic high resistivity region formed by the base region 4 between the highly-doped p-type anode region 3 and the highly-doped n-type cathode region 2.

When the voltage applied to the anode electrode 13 is negative with respect to the cathode, the p-n junction 17 will be reverse-biased and will block current flow between the anode and cathode regions 3 and 2. However, when the voltage applied to the anode electrode 13 is positive with respect to the cathode, the p-n junction 17 will be forward-biased and current will flow along the path 5 between the anode and cathode regions 3 and 2; in this ON-state of the diode the voltage drop across the diode will be low as a result of the modulation of the resistivity of the base region 4 by the holes and electrons injected from the anode and cathode regions 3 and 2 respectively. This voltage drop is also reduced by an additional current path for holes which is formed by the p-type gate region 6; as a result of the voltage difference in the base region 4 on either side of the groove 20, the junction 7 on the anode side of the groove 20 serves to collect holes while on the cathode side the junction 7 emits holes into the region 4 so providing the additional current path.

When the gate junction 7 is reverse-biased, however, a depletion layer 8 presents at this junction 7 expands and spreads mostly in the base region 4; in the particular form of device shown in FIGS. 2 and 3, this is achieved by applying to the gate electrode 16 a more negative potential (−Vg) than that applied to the cathode electrode 12 (for example, earth potential). When this gate to cathode voltage (−Vg) is sufficiently high so that the depletion layer 8 reaches the groove 20 as shown in FIG. 3, the depletion layer 8 interrupts the current path 5 between the anode and cathode regions 3 and 2 so cutting off conduction between the anode and cathode. This turn-off of the diode can occur extremely rapidly. As shown in FIGS. 2 and 3 the groove 20 has a v-shaped cross-section, one advantage of which is that its depth can be accurately determined by the dimensions of a mask window through which it can be formed by anisotropic etching, as will be described hereinafter. It is an advantage for conduction to be cut-off with a small gate voltage (−Vg); to achieve this, the distance between the bottom of the groove 20 and the junction 7 should be small. Anisotropic etching permits the depth of this V-shaped groove to be accurately defined. Another advantage of the V-shape of the groove 20 is that it provides a bevel which reduces the electric field in the depletion layer 8 adjacent the surface of the groove 20; this increases the surface breakdown voltage between the anode region 3 and the gate region 6 (and hence the cathode region 2) when the device is in the OFF-state with a high positive anode potential. A further advantage of having a V-shape for the groove 20 is that the length of the current path 5 where it is constricted between the gate region 6 and the groove 20 is small so that this short constriction does not greatly increase the resistance along the path 5 between the cathode and anode regions 2 and 3.

As shown in FIGS. 2 and 3 the groove 20 has an insulating and passivating layer 27 covering its surface. The layer 27 serves to passivate both the diode junction 17 and the sensitive surface of the groove 20 swept by the depletion layer 8. The layer 27 may be of, for example, thermally grown silicon oxide having a thickness of, for example, 0.3 micron.

In a typical case, the gap between the V-shaped groove 20 and the gate junction 7 may be, for example, between 10 and 20 microns ($\mu$m) and a base region 4 having a resistivity of, for example, 50 ohm-cm; such a diode can have a gate turn-off voltage of, for example, 20 volts. With a base region thickness of 70 microns between junctions 7 and 17 the diode may be operated with voltages of, for example, at least 500 volts applied between its cathode and anode electrodes 12 and 13.

The diode of FIGS. 1 to 3 combines a low forward voltage drop (in the ON-state) with a fast turn-off and can be useful for switching moderate levels of electrical power, for example, at high frequencies. The manufacture of such a diode is also comparatively easy, as will now be described with reference to FIGS. 4, 5 and 6.

Figure 4:
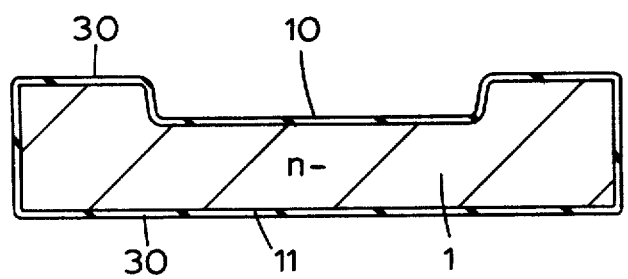
FIG. 4 is a cross-sectional view of a semiconductor wafer at an early stage in the manufacture of the diode of FIGS. 1 to 3.

The starting material is a monocrystalline silicon wafer 1 having a resistivity corresponding to the desired resistivity of the base region 4; the wafer 1 has its major surfaces on (100) crystal planes and has a larger thickness than the body portion shown in FIGS. 1 to 3. The wafer thickness may be, for example, 220 microns ($\mu$m). The wafer 1 is provided with an etchant-masking layer except at the central portion of its front surface and is then subjected in known manner to an etchant treatment to thin the central portion of the wafer to, for example, 130 microns. In this thinner central portion the active device area shown in FIGS. 1 to 3 is to be formed; this thin central portion is supported around its periphery by a remaining annular portion having the original thickness of the wafer. The wafer surfaces are then oxidized to form a silicon oxide layer 30 for use as a diffusion mask. The resulting structure is illustrated in FIG. 4.

Using known lithographic and etching techniques at the major surface 10 of the wafer 1, a window is opened in the layer 30 where the cathode region 2 is to be formed. Phosphorus is then diffused through this window to provide in the wafer 1 the donor concentration for the cathode region 2; this diffusion may be effected to a depth of, for example, 20 microns.

Figure 5:
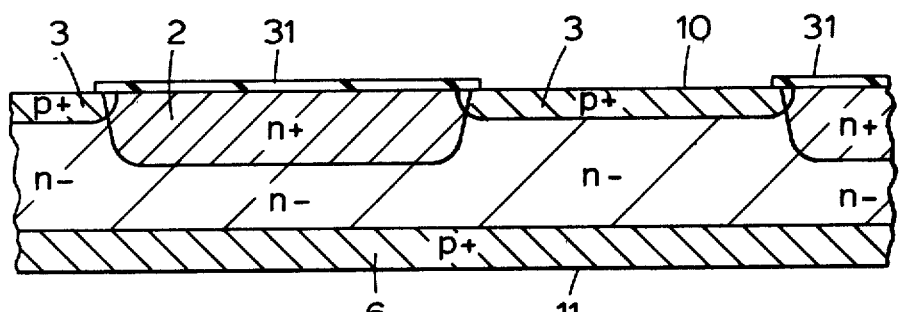
FIGS. 5 and 6 are cross-sectional views of part of the wafer of FIG. 4 corresponding to the body part shown in FIG. 2 at two later stages in the manufacture of the diode.

After oxidizing the exposed wafer surface, the oxide layer may then be removed (using known lithographic and etching techniques) from the area of the surface 10 where the anode region 3 is to be formed and from the whole of the opposite surface 11 where the gate region 6 is to be formed. The remaining oxide forms the diffusion mask 31 shown in FIG. 5 for defining the anode region pattern by, for example, boron diffusion. The gate region 6 may be formed simultaneously with the anode region 3. The boron may be diffused to a depth of, for example, 30 microns ($\mu$m). During this boron diffusion the cathode phosphorus concentration diffuses further in the wafer 1 so that the final depth of the cathode region 2 may be, for example, at least 50 microns; in this way, the main electrode region (in this case region 2) which has the same conductivity type as the base region 4 extends deeper in the wafer body than does the main electrode region (in this case region 3) of opposite conductivity type. This further reduces the voltage drop across the diode in the ON-state. The resulting diffused region structures 2,3 and 6 are illustrated in FIG. 5.

Figure 6:
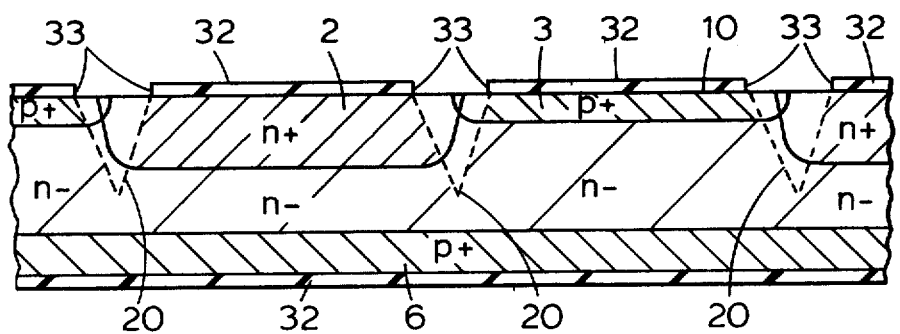

The top surface 10 of the wafer is then provided with a layer from which an etchant-mask pattern 32 is then formed in known manner. The resulting structure is illustrated in FIG. 6. The layer pattern 32 may be of, for example, silicon oxide and has a window 33, the pattern of which corresponds to the desired pattern of the groove 20 shown in FIG. 1. The groove 20 can be formed with a V-shape cross-section using a known anisotropic etchant which preferentially etches faster in certain lattice directions than in others. Suitable known etchants are, for example, an alkaline solution containing potassium hydroxide, propanol and water or a solution of hydrazine and water. The major surfaces 10 and 11 of the body 1 are (100) crystal lattice planes. When using such etchants, the (100) planes are etched much faster than the (111) planes. The sides of the window 33 are aligned with 110 directions on the surface 10. The V-shaped groove 20 formed by etching at this window 33 has sides which are formed by 111 crystal planes and which intersect at a depth which is approximately 0.7 times the width of the window 33. When the apex of the V-shaped groove 20 is formed the (100) plane is no longer exposed so that hardly any further etching occurs; the etching process is therefore virtually self-limiting. The resulting (111) side walls of the groove 20 are illustrated in broken outline in FIG. 6. However, it is of course possible to stop the etching process before the apex of the V-shaped groove is formed; in such a case, the resistance through the base region 4 between the anode and cathode regions 3 and 2 may be monitored during the etching process, and etching may be terminated, when for example a desired resistance value is obtained for the current path 5.

The semiconductor wafer may then be subjected in known manner to a thermal oxidation treatment to grow the silicon oxide passivating layer 27 on the (111) faces of the grooves. Subsequently, cathode and anode contact windows are opened by etching away oxide present on the cathode and anode regions 2 and 3 at the surface 10. During the same etching treatment the whole of the back surface 11 can be exposed for contacting the gate region 6. The cathode, anode and gate electrodes 12, 13 and 16 respectively can then be provided in known manner to form the device as shown in FIGS. 1 and 2. The top electrodes 12 and 13 may be of, for example, deposited aluminum.

Figure 8:
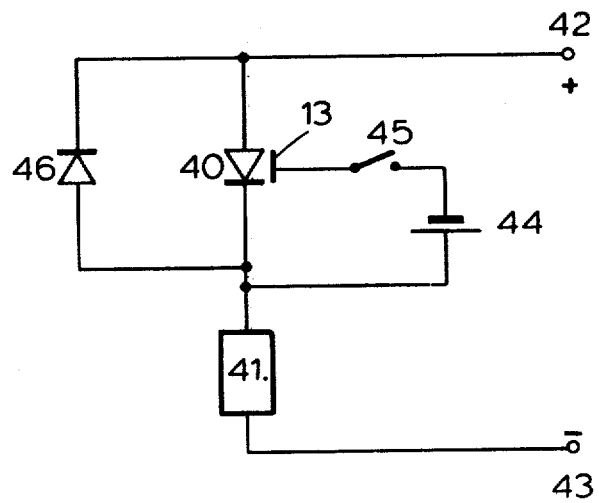
FIG. 8 is a circuit diagram of an arrangement in accordance with the second and third aspects of the invention.

FIG. 8 illustrates one particular form of control arrangement using a gate turn-off diode 40 in accordance with the invention. The gate turn-off diode is represented by a conventional diode symbol with an associated gate terminal.

The arrangement comprises a load 41 and a current path connected between a supply terminal 42 and one side of the load 41. The other side of the load is connected to the other terminal 43 of the power supply. The current path comprises the gate turn-off diode 40 having (in this example) its cathode (and hence region 2) connected to the load 41, and its anode (and hence region 3) connected to the supply terminal 42.

Means 44, 45 are connected to the gate electrode 16 of the diode 40 for applying a control signal to the diode for controlling the transmission of current along the current path and so controlling the energization of the load 41. This gate control signal reverse biases the gate junction 7 to permit interruption of the current path between the anode and cathode by the depletion layer 8 extending to the recess 20 from the reverse-biased p-n junction 7. In the case of an n-type base region 4, a negative voltage of suitable magnitude should be applied to the gate electrode 16. The means 44, 45 illustrated by way of example in FIG. 8 for applying this control signal are a battery or other potential source 44 and a switch 45.

The load 41 may be, for example, a d.c. permanent-magnet motor for which a d.c. power supply 42,43 is used. Since such a load is inductive a return path for the inductive energy is provided by a conventional diode 46 connected in inverse-parallel relationship with the diode 40.

The gate turn-off diode 40 may of course be connected on the other side of the load 41, namely with its cathode connected to the supply terminal 43. It will be evident that gate turn-off diodes in accordance with the invention can be used in many control circuit configurations, and for example, combinations of such diodes may be used in, for example, a three-phase a.c. motor control circuit.

Figure 7:
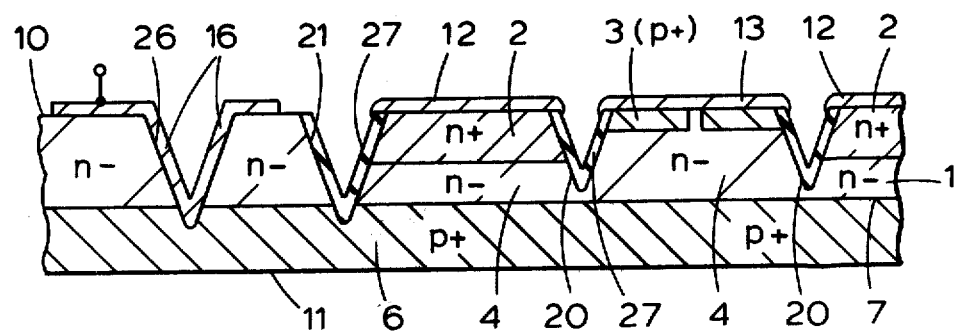
FIG. 7 is a cross-sectional view of part of the active portion of another diode in accordance with the first aspect of the invention and having a top gate electrode.

It will be obvious that many modifications are possible within the scope of the present invention. In the diode of FIGS. 1 to 3, the gate electrode 16 contacts the region 6 at the surface 11. This provides a particularly compact structure and is convenient when the gate connection is a conductor on which the diode body 1 is mounted in the device envelope. However, it may be desirable to provide the gate electrode 16 at the front surface 10 of the body 1. FIG. 7 illustrates a modification of the diode of FIGS. 1 to 3 showing one possible form of a top gate electrode structure; in this form the gate electrode 16 contacts the gate region 6 at a deeper recess in the form of a further groove 26 in the surface 10; the groove 26 extends from the surface 10 to the region 6. This gate contact area is separated from the cathode region area by an isolation groove 21 which also extends into the region 6 and may have the same depth as the groove 26. In order to reduce the gate contact resistance it is preferable for both the grooves 21 and 26 and the gate electrode 16 to have an annular form which surrounds the active area of the diode. Both the grooves 21 and 26 can be formed simultaneously with the shallower groove 20 by etching these grooves 21 and 26 through wider windows in the etchant mask 33 illustrated in FIG. 6. Although it is particularly easy tio fabricate the diode structure with the gate region 6 adjoining the back surface 11 of the body 1, the region 6 need not adjoin the surface 11, especially when the gate electrode 16 is provided at the top surface 10. For instance, the gate region 6 may be formed by a buried layer. Although an n-type base region diode has been described, diodes in accordance with the invention may have a high resistivity p-type base region 4 and a low resistivity n-type gate region 6.

Instead of having a V-shaped cross-section or being formed by an etched groove, the recess 20 between the cathode and anode regions 2 and 3 may be formed by locally oxidizing the surface 10 to sink a silicon oxide layer into the body 1 by thermal growth; local oxidation techniques using, for example, silicon nitride masking are described in, for example, Philips Research Reports, Vol. 25, April 1970, pages 118 to 132. By using such techniques the recess 20 can be formed by the growth of the oxide into the body 10; in order to sink the oxide layer over at least most of its thickness in the body 1 and to obtain a sufficiently deep recess, a material-removing treatment (as described in the said Philips Research Report publication) is also performed at the area where the recess 20 is to be formed.

Although the anode region 3 has been shown as continuous in FIGS. 1 to 3 it may have such a configuration that part of the base region 3 extends through the region 3 and is short-circulated at the surface 10 to the anode electrode 13; thus, the region 4 may extend to the surface 10 through perforations in a continuous region 3, or the region 3 may be discontinuous, for example in the form of a pattern of separate p-type islands interconnected by the common electrode 13. One such short is illustrated in FIG. 7. By providing such short-circuits in the anode-region 3 the turn-off time of the diode can be further reduced.

Although a silicon body 1 has been described it will be evident that other monocrystalline semiconductor materials may be used. Other materials than silicon oxide may also be used for the layer 27, for example a deposited glass or oxygen-doped polycrystalline silicon, and such materials may be used individually or in combination. The recess 20 in the surface 10 may be completely filled with insulating and passivating material(s), if so desired; this may, for example, strengthen the body 1 at the area of the recess and provide a flat surface for these material(s) substantially coplanar with the surface 10.

What is claimed is:

1. A gate turn-off diode for power switching applications which comprises a semiconductor body having first and second opposite major surfaces, and comprising an n-type cathode region, a p-type anode region, a base region of a first conductivity type and a higher resistivity than that of said cathode and anode regions, a main current path which extends thorugh said base region between the cathode and anode regions, the base region having a conductivity-type-determining dopant concentration of at most about $5\times10^{14}$ atoms per c.c. and forming a first p-n junction with one of the cathode and anode regions, a gate region which is of a second conductivity type opposite to that of the base region and forms with the base region a second p-n junction adjacent the main current path, and a gate electrode connected to the gate region for biasing the second p-n junction to permit interruption of said current path by forming a depletion layer, which extends from the biased second p-n junction toward said cathode and anode regions, said cathode and anode regions adjoining said first major surface and the gate region being located on the side of the base region remote from said first major surface, the thickness of the base region between the first and second p-n junctions being more than 25 microns, that region of the anode and cathode regions which is of the same conductivity type as the base region extending closer to the gate region than the other of the anode and cathode regions, and a first recess in said first major surface laterally separating the anode and cathode regions and extending through the base region towards said second p-n junction so that the depletion layer from the biased second p-n junction can extend to said first recess to interrupt the current path.

2. A diode as claimed in claim 1 wherein said first recess is a groove having a V-shaped cross-section.

3. A diode as claimed in claim 2, wherein said first recess has an insulating and passivating layer at its surface.

4. A diode as claimed in claim 1, wherein part of the base region extends to said first major surface through that region of the anode and cathode regions which is of opposite conductivity type to that of the base region, and this part of the base region is connected to said region of said opposite conductivity type by an electrode at said first major surface.

5. A diode as claimed in claim 1, wherein the gate region adjoins the opposite major surface of the body.

6. A diode as claimed in claim 5, wherein the gate electrode contacts the gate region at said opposite major surface of the body.

7. A diode as claimed in claim 6, wherein the gate electrode is present at said first major surface of the body and contacts the gate region via a second, deeper recess extending from said first major surface to the gate region.

8. A control arrangement for controlling the transmission of current along a current path which includes a gate turn-off diode as claimed in claim 1, wherein the current path is connected between the anode and cathode regions of the diode, and means for applying a control signal to the diode are connected to the gate electrode to permit interruption of the current path between the anode and cathode regions by a depletion layer extending to said first recess from the biased second p-n junction.

9. An arrangement comprising a load and a current path connected between a supply terminal and one side of the load, said current path comprising a gate turn-off diode as claimed in claim 1, wherein the diode has a selected one of its anode and cathode regions connected to the load and the other of its anode and cathode regions connected to the supply terminal, means being connected to the gate electrode for applying a control signal to permit interruption of the current path between the anode and cathode regions by a depletion layer extending to said first recess from the biased second p-n junction.

* * * * *